United States Patent [19]
Chen et al.

[11] Patent Number: 6,143,625
[45] Date of Patent: Nov. 7, 2000

[54] PROTECTIVE LINER FOR ISOLATION TRENCH SIDE WALLS AND METHOD

[75] Inventors: Ih-Chin Chen, Richardson; Amitava Chatterjee; Somnath S. Nag, both of Plano, all of Tex.

[73] Assignee: Texas Instruments Incorporated, Dallas, Tex.

[21] Appl. No.: 09/151,374

[22] Filed: Sep. 10, 1998

Related U.S. Application Data

[62] Division of application No. 08/972,806, Nov. 19, 1997, abandoned.

[51] Int. Cl.$^7$ ................................................ H01L 21/76
[52] U.S. Cl. .......................... 438/435; 438/424; 438/427; 148/DIG. 50
[58] Field of Search ................... 438/424, 427, 438/435, 437, 296; 148/DIG. 50

[56] References Cited

U.S. PATENT DOCUMENTS

| | | | |
|---|---|---|---|
| 4,862,240 | 8/1989 | Watanabe et al. | 357/42 |
| 5,561,078 | 10/1996 | Tasaka | 437/67 |
| 5,719,085 | 2/1998 | Moon et al. | 438/424 |
| 5,736,462 | 4/1998 | Takahashi et al. | 438/692 |
| 5,741,740 | 4/1998 | Jang et al. | 438/435 |
| 5,976,947 | 11/1999 | Reinberg | 438/424 |

OTHER PUBLICATIONS

U.S. application No. 08/871,738, filed Jun. 9, 1997, entitled "Integrated Circuit Insulator and Method", by Somnath S. Nag et al. (pending).

*Primary Examiner*—Trung Dang
*Attorney, Agent, or Firm*—Lawrence J. Bassuk; Frederick J. Telecky

[57] ABSTRACT

An isolation trench (60) may comprise a trench (20) formed in a semiconductor layer (12). A barrier layer (22) may be formed along the trench (20). A protective liner (50) may be formed over the barrier layer (22). The protective liner (50) may comprise a chemically deposited oxide. A high density layer of insulation material (55) may be formed in the trench (20) over the protective liner (50).

5 Claims, 2 Drawing Sheets

PROTECTIVE LINER FOR ISOLATION TRENCH SIDE WALLS AND METHOD

RELATED APPLICATION

This a divisional of Ser. No. 08/972,806, filed Nov. 19, 1997.

This application is related to copending U.S. patent application Ser. No. 08/974,324, entitled "IN-SITU LINER FOR ISOLATION TRENCH IDE WALLS AND METHOD".

TECHNICAL FIELD OF THE INVENTION

The present invention relates generally to the field of integrated circuits, and more particularly to a protective liner for isolation trench side walls and to a method of fabricating the same.

BACKGROUND OF THE INVENTION

Semiconductor components must be properly isolated from one another to function properly. For example, the state and conductance of individual transistors can only be controlled if proper isolation exists among the transistors. If not, leakage currents may occur, causing power dissipation, noise-margin degradation, and voltage shift on dynamic nodes. Additionally, cross talk among transistors can destroy the logic state of a gate.

In the past, field oxide bumps (LOCOS) have been used to isolate components of an integrated circuit. Field oxide bumps are typically formed by first pattern and etching the isolation areas. The substrate is then subjected to thermal treatment to grow field oxide at the isolation areas. Field oxide bumps are not scalable below 0.5 microns. Accordingly, field oxide bumps do not provide a satisfactory isolation system for sub 0.5 micron applications.

More recently, shallow trench isolation structures have been used for sub 0.5 micron applications. Typically, a narrow trench is formed in a substrate. The trench may be filled with an insulating material using high density plasma deposition to prevent voids from forming in the insulating material of the trench. High density plasma deposition results in a high density oxide that advantageously resists etching and other processing steps associated with semiconductor fabrication. Such shallow trench isolation structures, however, often leak current, which degrades integrated circuit performance.

SUMMARY OF THE INVENTION

Accordingly, a need has arisen in the art for an improved integrated circuit isolation structure. The present invention provides an isolation trench having a protective liner that substantially eliminates or reduces the disadvantages and problems associated with using high density plasma (HDP) chemical vapor deposition (CVD) to form shallow trench isolation structures.

In accordance with the present invention, an isolation trench may comprise a trench formed in a semiconductor layer. A barrier layer may be formed along the trench. A protective liner comprising a chemically deposited oxide may be formed over the barrier layer. A high density layer of insulation material may be formed in the trench over the protective liner.

More specifically, in accordance with one embodiment of the present invention, the barrier layer may comprise a thermal oxide. The protective liner may comprise TEOS. The layer of high density insulation material may comprise an oxide deposited using high density plasma deposition with a high bias RF.

Important technical advantages of the present invention include providing a shallow trench isolation structure that substantially reduces or eliminates current leakage. In particular, a protective liner may be first deposited in an isolation trench. The protective liner prevents sputtering associated with later high density plasma deposition from damaging the trench side walls and causing current leakage.

Another technical advantage of the present invention includes providing a robust trench oxide. In particular, the protective liner may be densified by thermal treatment. The trench may be filled with high density plasma deposited oxide.

Other technical advantages will be readily apparent to one skilled in the art from the following figures, descriptions, and claims.

BRIEF DESCRIPTION OF THE DRAWINGS

For a more complete understanding of the present invention and its advantages thereof, reference is now made to the following description taken in conjunction with the accompanying drawings, wherein like reference numerals represent like parts, in which.

DETAILED DESCRIPTION OF THE INVENTION

Figure 1A:
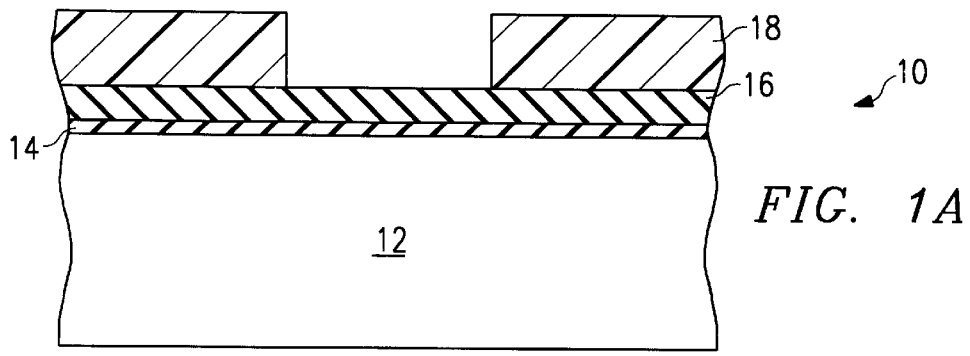
FIGS. 1A–F are a series of schematic cross-sectional diagrams illustrating a trench isolation process using a protective liner in accordance with one embodiment of the present invention.
Figure 1B:
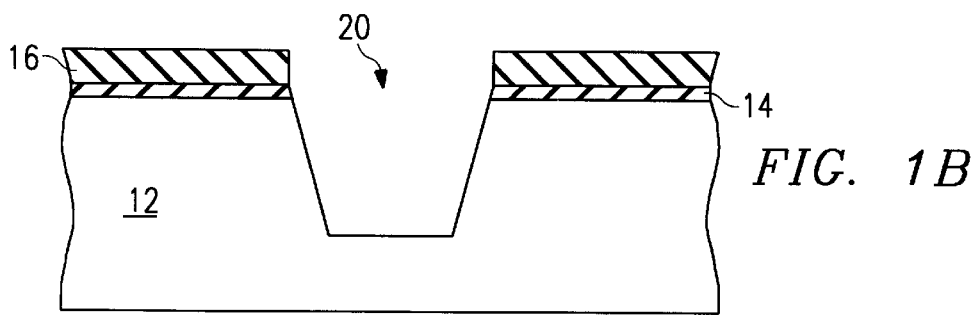
Figure 1C:
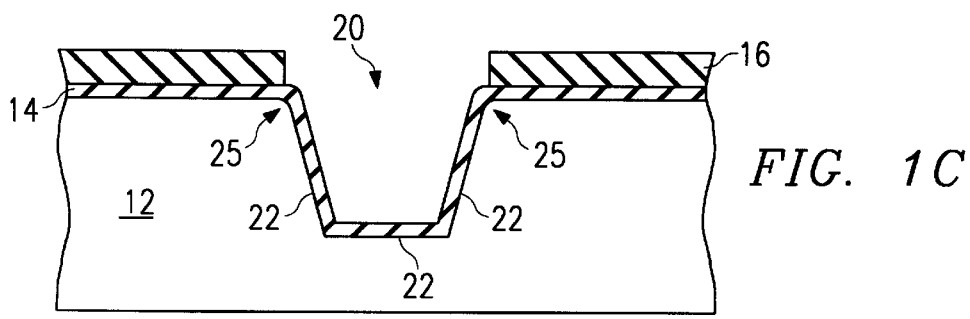
Figure 2:
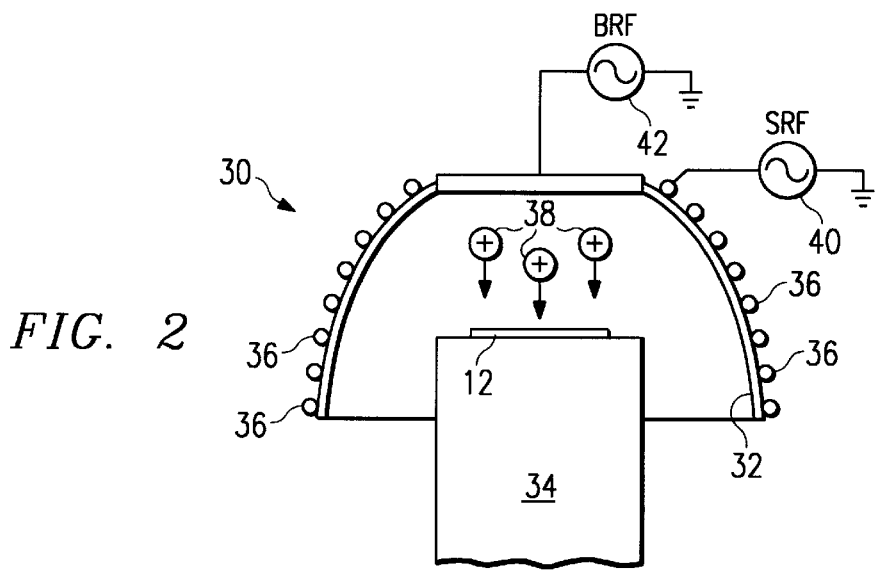
FIG. 2 illustrates a high density plasma (HDP) reactor for depositing oxide during the trench isolation process of FIGS. 1A–F.

The preferred embodiments of the present invention and its advantages are best understood by referring now in more detail to FIGS. 1–2 of the drawings, in which like numerals refer to parts throughout the several views. FIGS. 1–2 illustrate a method and system for fabricating an isolation trench using a protective liner comprising a chemically deposited oxide to reduce or eliminate current leakage along the trench.

FIG. 1A illustrates an initial semiconductor structure 10 for constructing an isolation trench in accordance with one embodiment of the present invention. The initial semiconductor structure 10 may comprise a semiconductor layer 12. In one embodiment, the semiconductor layer 12 may comprise silicon. It will be understood that the semiconductor layer 12 may comprise other types of semiconductor material. The semiconductor layer 12 may be a substrate such as a wafer. It will be understood that the semiconductor layer 12 may also be a layer of semiconductor material formed on a substrate. For example, the semiconductor layer 12 may be an epitaxial layer grown on a wafer. An oxide layer 14 may be formed on the surface of the semiconductor layer 12. The oxide layer 14 may comprise silicon dioxide deposited or thermally grown on the surface of the semiconductor layer 12 in accordance with conventional techniques. In one embodiment, the oxide layer 14 may be 100 angstroms thick. A nitride layer 16 may be formed on the oxide layer 14. The nitride layer 16 may be silicon nitride deposited on the oxide layer 14 in accordance with conventional techniques. In one embodiment, the nitride layer 16 may be 0.2 microns thick. As described in more detail below, the nitride layer 16 may form a polish stop for later mechanical polishing of trench insulation material.

A photoresist layer 18 may be deposited on the nitride layer 16 in accordance with conventional techniques. The photoresist layer 18 may be patterned and etched to expose an underlying section of the nitride layer 16, oxide layer 14, and semiconductor layer 12. The isolation trench of the present invention may be formed at this section of the semiconductor layer 12.

Referring to FIG. 1B, a trench 20 may be formed in the semiconductor layer 12. The trench 20 may be formed by plasma etching the nitride layer 16, oxide layer 14 and semiconductor layer 12 with chlorine-based chemistry. It will be understood that the trench 20 may be otherwise formed within the scope of the present invention. Thereafter, the photoresist layer 18 may be removed from the nitride layer 16 using conventional techniques.

In one embodiment, the trench 20 may have a width of 0.5 microns or less and an aspect ratio of 2:1 or greater. In the particular embodiment, trench 20 may have a width of 0.25 microns and a depth of 0.7 microns. Trench side walls may have a slope of about 75 degrees. It will be understood that the trench 20 may have a different geometry within the scope of the present invention.

Referring to FIG. 1C, a barrier layer 22 may be formed along the trench 20. The barrier layer 22 may protect the semiconductor layer 12 from contaminants contained in insulation material later deposited in the trench 20. In one embodiment, the barrier layer 22 may comprise a thermal oxide grown on the base and side walls of the trench 20. Thermal oxide is preferred to deposited oxide because of contaminants normally associated with deposited oxides. Additionally, growth of the thermal oxide may repair deformities caused by etching the trench 20. The thermal oxide may be conventionally grown in a high temperature furnace. In the furnace, the semiconductor structure may be exposed to ambient gas comprising oxygen.

In one embodiment, the thermal oxide of the barrier layer 22 may be grown to a thickness of between 100 to 200 angstroms. In this embodiment, the thermal oxide may merge with the oxide layer 14 at the edge of the trench 20 and provide an optimal rounding of corners 25 at the edges. Rounding of the corners 25 helps protect the semiconductor layer 12 from being exposed during later processing.

Referring to FIG. 2, insulation material may be deposited in the trench 20 using a high density plasma reactor 30. High density plasma deposition is preferred because it deposits high density insulation material at a relatively low deposition temperature. Additionally, the deposited high density insulation material may have a low moisture absorption rate, a low wet etch rate, a high thermal stability, low stress, and be electrically robust.

The reactor 30 may include a quartz dome 32 disposed over an e-chuck 34. The semiconductor structure may be disposed on the e-chuck 34 during trench fill deposition. An inductive coil 36 may be disposed around the quart dome 32. The inductive coil 36 may provide a high density source of plasma, or charged ions 38, within the reactor 30. A source RF 40 controls generation of the charged ions 38. A bias RF 42 controls acceleration of the charged ions 38 toward the semiconductor layer 12 on the e-chuck 34. Accordingly, the high density plasma reactor 30 may include a deposition component and a sputter component.

The deposition component of the reactor 30 deposits material onto the semiconductor structure while the sputter component bombards the semiconductor structure and any deposited material with the charged ions 38. The sputter component of the reactor 30 may be controlled by adjusting the bias RF 42. A low bias RF will reduce the sputter component and the density of the deposited material. A high bias RF will increase the sputter component and the density of the deposited material.

Referring to FIGURE iD, a protective liner 50 may be deposited over the barrier layer 22 of the trench 20 and the nitride layer 16. The protective liner 50 may comprise a chemically deposited oxide. In one embodiment, the protective liner 50 may comprise TEOS. It will be understood that the protective liner 50 may comprise other chemically deposited oxides within the scope of the present invention. For example, the protective liner 50 may comprise SACVD.

In one embodiment, the protective liner 50 may be formed by chemical vapor deposition (CVD) in the reactor 30. In this embodiment, the sputter component of the reactor 30 may be off. The lack of a sputter component will prevent the side walls of the trench 20 from being damaged during deposition of the protective liner 50. Such damage can lead to current leakage at the trench 20 of adjacent integrated circuit components.

As previously described, the sputter component of the reactor 30 may be controlled by the bias RF 42. Accordingly, a bias RF 42 of 0 watts may be used for deposition of the protective liner 50. It will be understood that the protective liner 50 may otherwise be formed within the scope of the present invention. For example, a protective liner 50 comprising TEOS may be formed conventionally in a furnace.

In one embodiment, the protective liner 50 may have a thickness of between 1,000 and 1,500 angstroms. In this embodiment, the protective liner 50 will protect the trench side walls from later deposition of high density insulation material. Additionally, this thickness will not cause voids to form in the insulation material of the trench 20. It will be understood that the thickness of the protective liner 50 may be varied within the scope of the present invention so long as the protective liner is capable of protecting the trench side walls during deposition of the remaining insulation material and will not cause voids to form.

After deposition, the protective liner 50 may be densified. The increased density will increase resistance of the protective liner 50 to etching and other processes used during semiconductor fabrication. In one embodiment, the protective liner 50 may be densified by thermal treatment in the reactor 30. In this embodiment, the protective liner 50 may be treated at a temperature of about 500° C. or greater for about 30 minutes or more. During thermal treatment, the protective liner 50 may be exposed to an inert ambient gas, such as nitrogen ($N_2$). It will be understood that the protective liner 50 may be otherwise densified within the scope of the present invention.

Figure 1D:
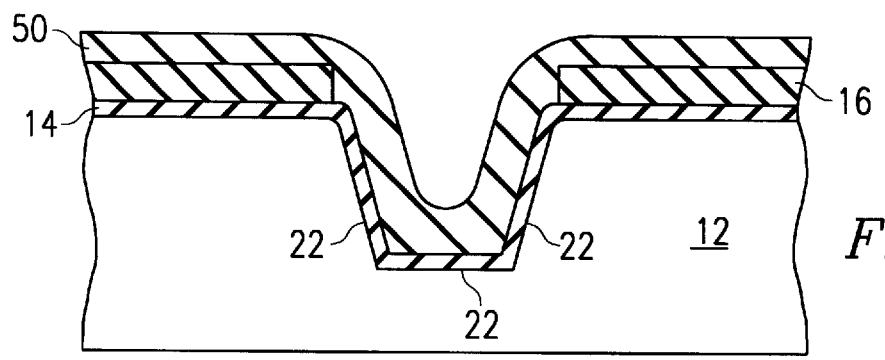
Figure 1E:
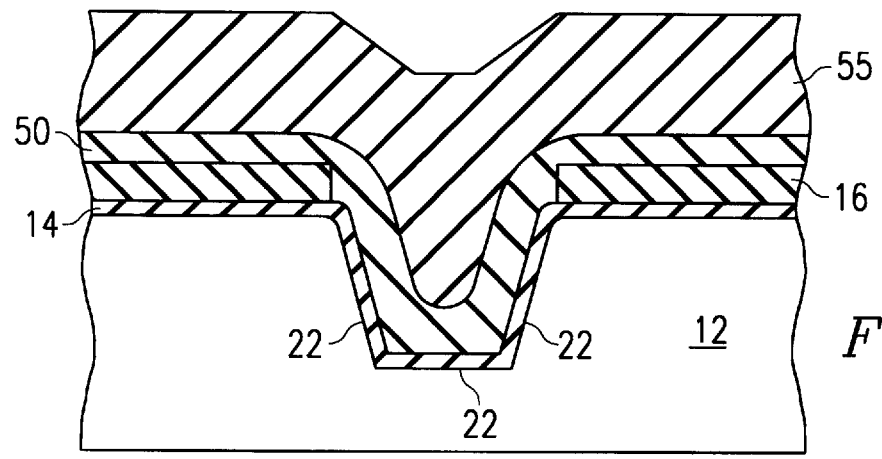

Referring to FIG. 1E, a high density layer of insulation material 55 may be deposited over the protective liner 50 to fill the trench 20. In one embodiment, the insulation material may be silicon dioxide. It will be understood that the insulating material may be another type of material capable of filling the trench 20 and isolating components of an integrated circuit. For example, the insulation material may be nitride or the like. The high density insulation layer 55 may be deposited in the reactor 30 with a high sputter component. The high density of the layer 55 will provide robust insulation capable of resisting etching and other processes used in integrated circuit fabrication. During deposition of the high density layer 55, the protective liner 50 will protect the trench side walls from the high sputtering component of the layer 55 and therefore will prevent current leakage at the trench 20.

As previously described, the sputter component of the reactor 30 may be controlled by the bias RF 42. In one embodiment, a bias RF 42 of approximately 1200 watts or greater may be used for deposition of the high density insulation layer 55. It will be understood that other bias RF 42 settings of the reactor 30 may be used within the scope of the present invention so long as the sputter component generates robust insulation material in the trench 20 without voids.

Figure 1F:
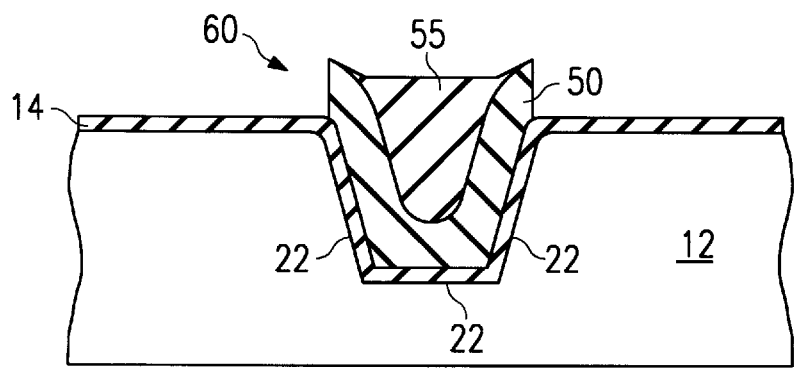

Referring to FIG. 1F, excess insulation material of liner 50 and layer 55 may be removed by chemically-mechanically polishing (CMP) the semiconductor structure using the nitride layer 16 as a polish stop. The nitride layer 16 may then be removed from the oxide layer 14 to leave the isolation trench 60. The nitride layer 16 may be removed with a phosphoric acid etch, a selective plasma etch, or the like. Accordingly, insulation material of the isolation trench 60 will protrude above the oxide layer 14 to isolate components of the integrated circuit.

Although the present invention has been described with several embodiments, various changes and modifications may be suggested to one skilled in the art. It is intended that the present invention encompass such changes and modifications as fall within the scope of the appended claims.

What is claimed is:

1. A method of forming an isolation trench of an integrated circuit, comprising the steps of:
    (a) forming a trench in a semiconductor layer;
    (b) forming a barrier layer along the trench;
    (c) chemically depositing an oxide protective liner over the barrier layer;
    (d) densifying the oxide protective liner from step (c); and
    (e) forming a high density layer of insulation material in the trench over the densified oxide protective liner.

2. The method of claim 1, the step of forming the high density layer of insulation material in the trench comprising the step of depositing an oxide using high density plasma deposition with a high bias RF.

3. The method of claim 1, further comprising the step of thermally treating the protective liner at a temperature of 500° C. or greater for 30 minutes or more in an inert ambient gas.

4. The method of claim 1, wherein the protective liner comprises TEOS.

5. The method of claim 1, wherein the protective liner comprises SACVD.

* * * * *